US006332988B1

United States Patent
Berger, Jr. et al.

(10) Patent No.: US 6,332,988 B1
(45) Date of Patent: Dec. 25, 2001

(54) REWORK PROCESS

(75) Inventors: Russell G. Berger, Jr., Hinesburg; Albert J. Gregoritsch, Jr., South Burlington, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/324,198

(22) Filed: Jun. 2, 1999

(51) Int. Cl.[7] .................................................. C23F 1/00
(52) U.S. Cl. ........................... 216/100; 216/2; 438/614; 438/754; 438/109; 252/79.1; 29/825; 29/840; 257/737; 257/738
(58) Field of Search .................................... 438/614, 754, 438/106, 108, 109; 252/79.1; 216/2, 100; 29/825, 840; 257/737, 738

(56) References Cited

U.S. PATENT DOCUMENTS

| | | | |
|---|---|---|---|
| 4,260,451 | 4/1981 | Schmeckenbecher | 156/664 |
| 4,415,606 | 11/1983 | Cynkar et al. | 427/90 |
| 4,787,958 | 11/1988 | Lytle | 156/652 |
| 4,814,293 | 3/1989 | Van Oekel | 437/192 |
| 5,130,275 | 7/1992 | Dion | 437/225 |
| 5,134,460 | 7/1992 | Brady et al. | 357/71 |
| 5,162,257 | 11/1992 | Yung | 437/183 |
| 5,293,006 | 3/1994 | Yung | 174/261 |
| 5,371,328 | 12/1994 | Gutierrez et al. | 174/261 |
| 5,381,946 | 1/1995 | Koopman et al. | 228/254 |
| 5,434,751 | 7/1995 | Cole, Jr. et al. | 361/792 |
| 5,462,638 | 10/1995 | Datta et al. | 156/656.1 |
| 5,462,891 | 10/1995 | Okada | 437/187 |
| 5,503,286 | 4/1996 | Nye, III et al. | 216/13 |
| 5,508,229 | 4/1996 | Baker | 437/183 |
| 5,578,273 | 11/1996 | Hanson et al. | 422/110 |
| 5,759,437 | 6/1998 | Datta et al. | 252/79.1 |
| 5,773,359 | * 6/1998 | Mitchell et al. | 438/614 |
| 6,080,709 | 6/2000 | Ishikawa et al. | 510/175 |

FOREIGN PATENT DOCUMENTS 55-138235 * 10/1980 (JP) ............................. H01L/21/306

OTHER PUBLICATIONS

Method to Monitor and Control Boil–Over of Hydrogen Peroxide Based Solutions, IBM Technical Disclosure Bulletin, vol. 38, No. 12, Dec. 1995.

* cited by examiner

Primary Examiner—Randy Gulakowski
Assistant Examiner—M. Kornakov
(74) Attorney, Agent, or Firm—Howard J. Walter, Jr

(57) ABSTRACT

A semiconductor wafer rework process sideways etches an underlying layer of metal to remove a difficult to etch upper layer of metal without substantially etching that upper layer and without damaging permanent layers of the wafer. If the underlying layer of metal is TiW and the permanent layer is aluminum, the TiW layer can be sideways etched with a hydrogen peroxide and ammonium hydroxide solution that does not damage aluminum lines that are permanently on the wafer. Thus, difficult to remove intermetallic layers, such as tin-copper or chrome-copper, that are located on an underlying layer of TiW, can be successfully removed without danger of damaging permanent aluminum metallization of the wafer.

6 Claims, 9 Drawing Sheets

REWORK PROCESS

FIELD OF THE INVENTION

This invention generally relates to rework, such as rework of semiconductor wafers. More particularly, it relates to a method of removing terminal metals, such as lead-tin solder bumps and their associated metal layers, from a semiconductor wafer without damaging remaining materials on the wafer, such as aluminum lines.

BACKGROUND OF THE INVENTION

Evaporated solder bumps or C4's have long been in use for bonding integrated circuit chips to a next level of assembly, such as a ceramic package. Traditional solder bumps have involved evaporating a series of layers on each wafer: lead and tin are evaporated on a thin layer of gold on layers of copper, chrome-copper, and chrome. The lead and tin layers are evaporated through a single thin metal shadow mask that is aligned to vias that open to chip metallization. The shadow mask is clamped in close contact with the wafer. This process has produced a very high yield of wafers with terminal metals. However, as the number of solder bumps needed on each chip has been increasing with each generation of logic chips, the shadow mask technique has begun to reach its limit in reducing the size and more closely packing the solder bumps.

A new method has been developed to electroplate solder bumps on wafers, as described in commonly assigned U.S. Pat. No. 5,503,286 to Nye et al, incorporated herein by reference. This technique has the potential to substantially lower cost, improve the efficiency of use of the solder materials, shrink the size of each solder bump, move the solder bumps closer together, and increase the number of solder bumps that can be placed on each chip. However, the electroplated process has required more complex processing and a more complex stack of metals under the solder bumps.

This more complex electroplating process has expanded the need to correct process errors (as compared with the well-established evaporated process) so that any wafers that are misprocessed can be reworked. The difficulty has been in removing each layer of the stack of layers of metal without any of the etchants damaging other insulating or metal layers that are to remain permanently on the wafer. As described in commonly assigned U.S. Pat. No. 5,462,638, incorporated herein by reference, there is concern that etchants could seep into the chip through pinholes and damage the internal structure of the chip, particularly aluminum lines. Without an adequate solution to this problem, wafers that were misprocessed had to be scrapped. Thus, a better solution for rework is required to remove the terminal metal layers on a wafer without the danger of damaging permanent metal or insulating layers on the wafer, and this solution is provided by the following invention.

SUMMARY OF THE INVENTION

It is therefore an object of the present invention to provide a process for removing a metal layer from a stack of metal layers without etching that layer.

It is yet another object of the present invention to provide a process for reworking electroplated solder bump wafers.

It is a further object of the present invention to provide a process for sideways etching one metal layer to remove layers above that metal layer.

It is a feature of the present invention that intermetallic layers of copper-tin and chrome-copper are removed by lateral etching an underlying tungsten containing layer.

It is another feature of the present invention that lead and tin are removed as a preliminary step so as to avoid their interfering with the lateral etching of the tungsten containing layer.

It is an advantage of the present invention that all solder bump metallurgy is removed without damaging underlying aluminum lines.

These and other objects, features, and advantages of the invention are accomplished by a removal process that comprises the step of providing a substrate having a first metal layer on a second metal layer on a permanent third layer. The next step involves removing the first metal layer and the second metal layer from the substrate by sideways etching the second metal layer with an etchant that does not substantially etch the first metal layer and that does not substantially damage the permanent third layer.

One embodiment of the invention is a terminal metal rework process. This process includes the step of providing a semiconductor wafer having terminal metals with a solder bump on layers of underlying metals, wherein the layers of underlying metals include a first metal layer on a second metal layer on the wafer. The wafer further comprises a permanent third aluminum metal layer, wherein the second metal layer contacts the permanent third aluminum metal layer. The next step involves removing the solder bump with a solder etchant. Next, the first metal layer and the second metal layer are removed from the substrate by sideways etching the second metal layer with an etchant that does not substantially etch the first metal layer and that does not substantially damage the permanent third aluminum metal layer.

BRIEF DESCRIPTION OF THE DRAWINGS

The foregoing and other objects, features, and advantages of the invention will be apparent from the following detailed description of the invention, as illustrated in the accompanying drawings, in which.

DETAILED DESCRIPTION OF THE INVENTION

Figure 1:
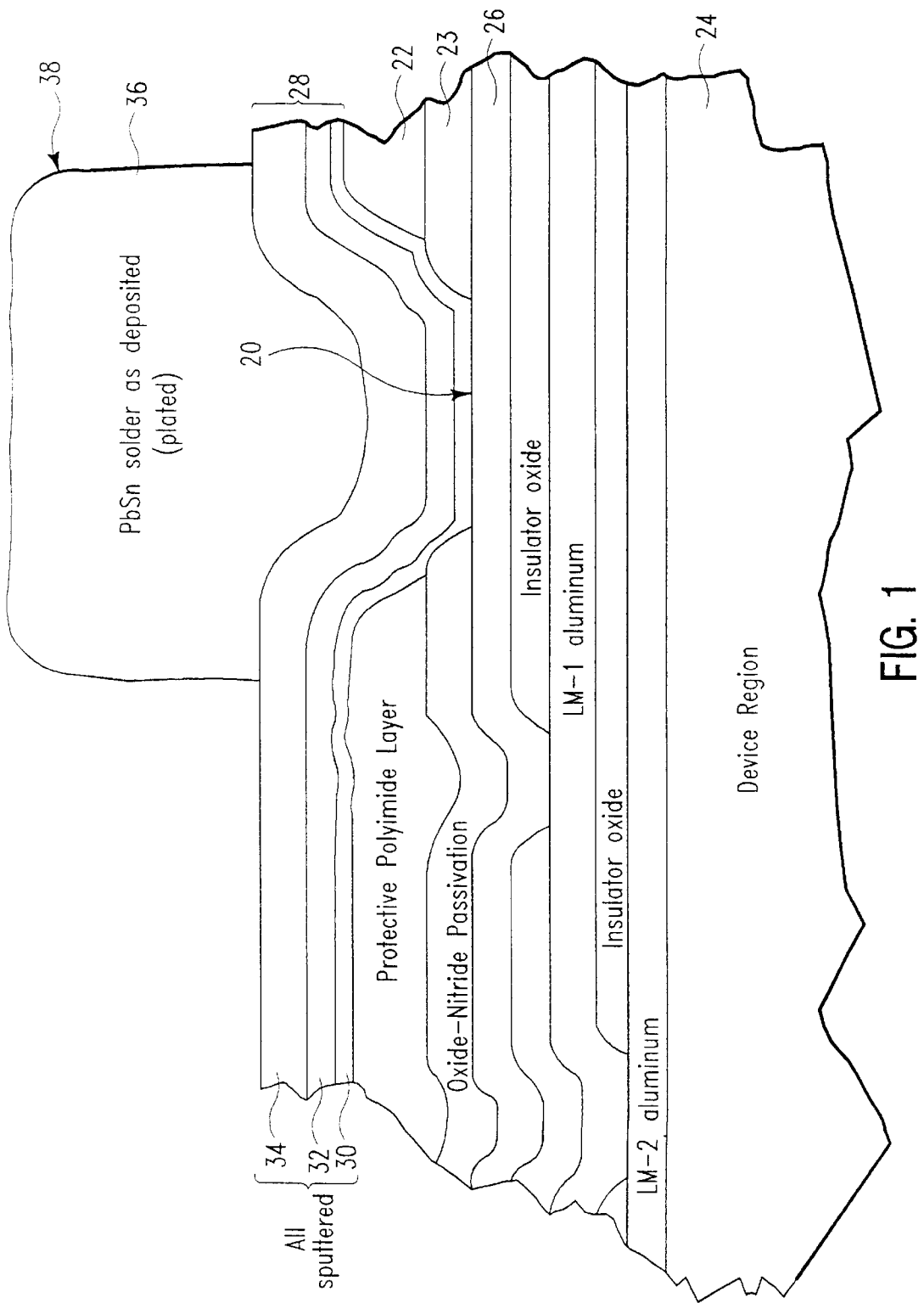
FIG. 1 is a cross sectional view showing a semiconductor wafer with blanket seed layers and electroplated solder bumps.
Figure 2:
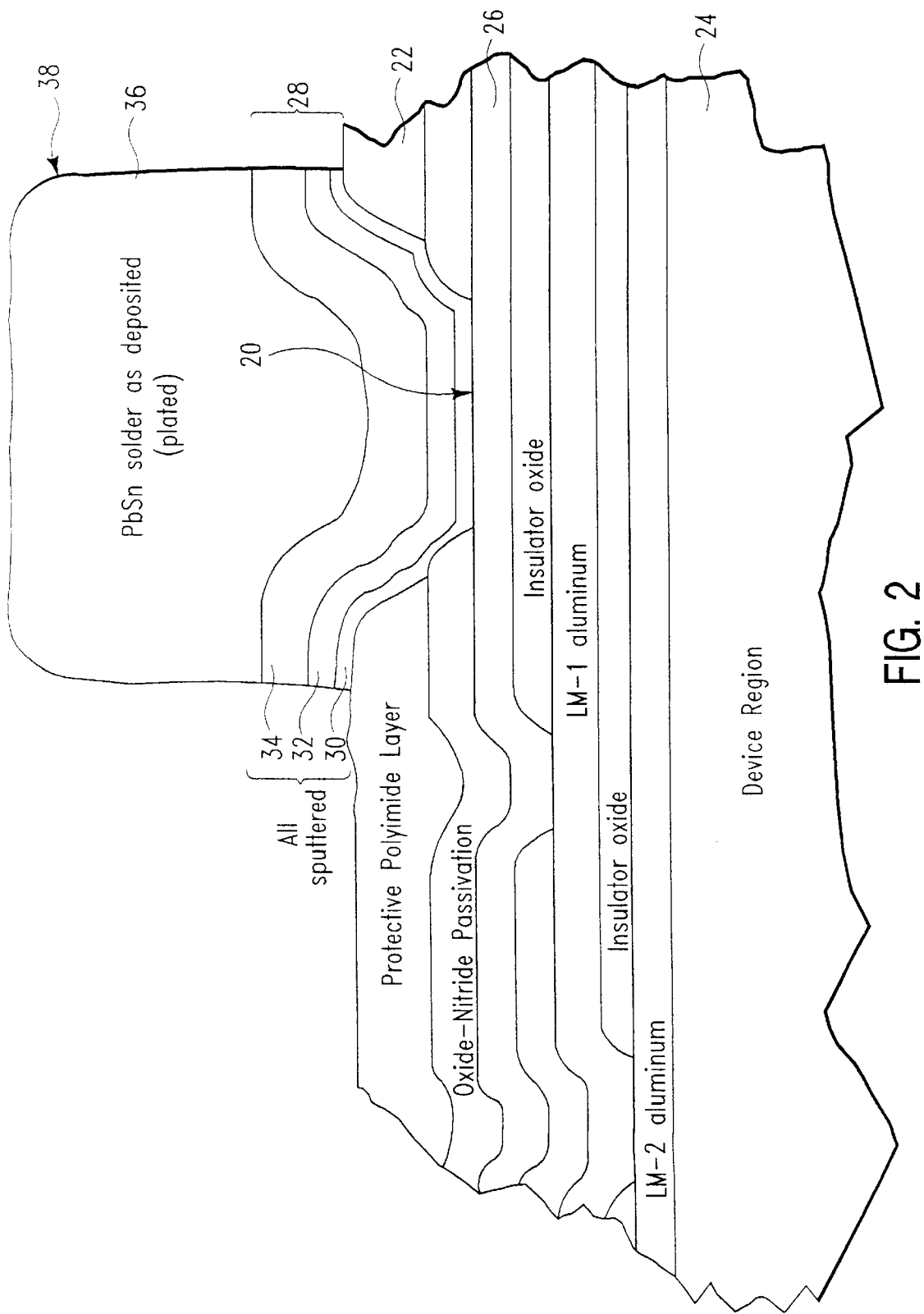
FIG. 2 is a cross sectional view showing a semiconductor wafer with exposed portions of the seed layer of FIG. 1 etched using the solder bumps as a mask to remove all seed layer between solder bumps while leaving the seed layer intact under the solder bumps.

The '638 patent describes a process of providing individual solder bumps on a wafer using electroplating. In the process, vias 20 are formed in insulating layers 22, 23 on wafer 24 to open access to last aluminum metal layer 26, as shown in FIG. 1. Then blanket layers of seed metals 28 are deposited. Layers of seed metals 28 include titanium-tungsten (TiW) layer 30, chrome-copper layer 32, and copper layer 34. In the next step, a mask having openings corresponding to desired positions of solder bumps is photolithographically formed on the wafer. Next, lead-tin solder bumps 36 defined by these openings in the mask are electroplated. Finally, layers of seed metals 28 exposed between solder bumps 36 are etched to electrically isolate each of the individual solder bumps from all the others, as shown in FIG. 2. The solder bumps provide the mask for this etch.

The '638 patent describes the bottom blanket layer of the seed layers as being TiW layer 30 which serves both as an adhesion layer and also as an etch stop layer to protect underlying layers of aluminum, such as last aluminum metal layer 26, from the chrome etchant used to remove exposed portion of chrome-copper layer 32. However, once that portion of TiW layer 30 between solder bumps 36 is itself etched away to isolate solder bumps 36 from each other in the original processing, that blanket layer of TiW 30 is no longer available to protect underlying aluminum lines, such as last aluminum layer 26, during a chrome etch or tin-copper etch rework step.

The present inventors recognized that a scheme was needed for removing lead-tin solder bumps 36 and layers of seed metals 28 under solder bumps 36 during rework that did not involve an etchant that could attack last aluminum metal line 26 through a pinhole or other defect in insulating layer 22. Rather than sequentially etching layers of metal, as described in the '638 process for the original wafer processing, the inventors discovered a rework process that uses a lateral etch or a sideways etch of lower TiW layer 30 of the stack of layers to float off difficult to remove upper layers of seed layers 28. Since the TiW etchant does not attack aluminum, the process safely avoids the potential for damaging last aluminum metal 26 within wafer 24. Thus, they found that aluminum lines and insulating layers that are to remain permanently on the wafer were undamaged. The entire process of depositing seed layers 28 and electroplating solder bumps on wafer 24 could now be done again to provide functional and reliable integrated circuit chips.

Figure 3:
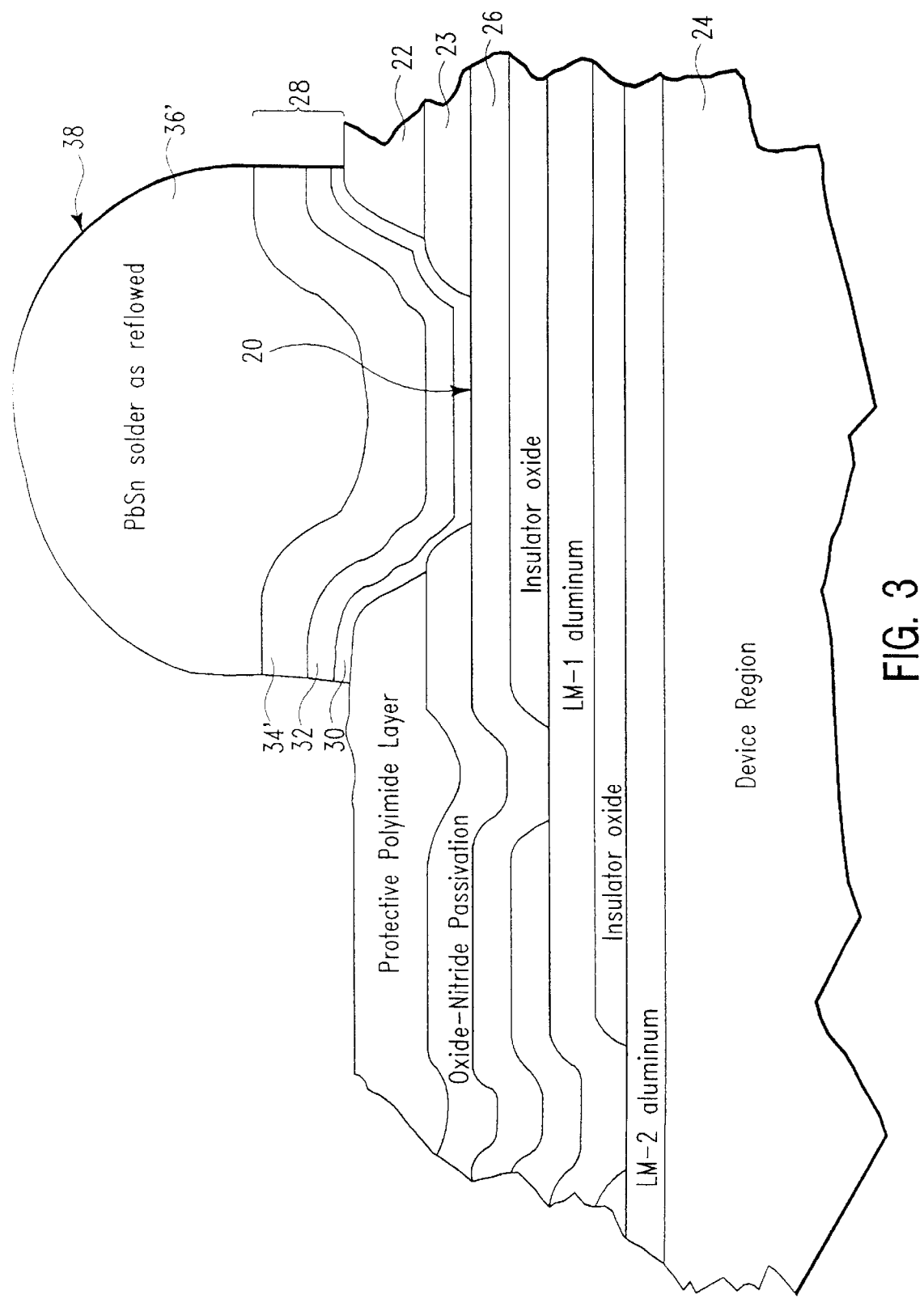
FIG. 3 is a cross sectional view showing the semiconductor wafer of FIG. 2 after heating to reflow the solder bumps.

The starting point for the rework process begins with a terminal metal stack of layers, as illustrated either in FIG. 2 for a wafer before reflow or in FIG. 3 for a wafer after reflow. Before reflow, terminal metal 38 located in via 20, includes sputtered mixed layer of titanium-tungsten 30 contacting last aluminum metal 26. On this layer is sputtered chromium-copper intermetallic layer 32, then sputtered copper layer 34, and finally electroplated lead-tin solder bump 36. TiW layer 30 has a thickness of about 1650A and is about 90% tungsten and 10% tungsten. Chrome-copper layer 32 has a thickness of about 1800A and is about half chrome, half copper. Copper layer 34 has a thickness of about 4300 A. Solder bump 36' is about 100 micrometers thick after reflow, as shown in FIG. 3. Lead-tin solder bump 36, 36' is about 97% lead and 3% tin. On heating to melt or reflow lead-tin solder layer 36, tin from solder bump 36 reacts with copper layer 34, consuming some or all of copper layer 34 to provide copper-tin intermetallic layer 34', as shown in FIG. 3. It is particularly copper-tin 34' and chromium-copper 32 intermetallic layers that have caused the problem with rework since etchants needed to remove these intermetallic layers also etch aluminum lines wherever they may be exposed.

The present inventors have found an etch process to remove all terminal metal layers down to bare last aluminum line 26 that overcomes this problem, leaving last aluminum metal 26 in pristine condition. The process essentially avoids etching the intermetallic layers, instead sideways etching underlying layer of titanium-tungsten metal 30, thereby lifting off chrome-copper layer 32 and copper-tin intermetallic layer 34'. The steps of this process are shown in the process flow chart presented in FIG. 4.

The inventors of the present invention found that the sideways etch could best be accomplished if lead-tin solder bumps 36 or reflowed lead-tin solder bumps 36' were first removed. Otherwise, they found, the lead-tin would interact unfavorably with the sideways etchant described below. In the first step, wafer 24 is immersed in a tank having a mixture of one part 30% $H_2O_2$ to one part glacial acetic acid (by volume) for 30 minutes at room temperature to remove lead-tin solder bumps 36 or reflowed lead-tin solder bumps 36', as shown in step 101 of the flow chart in FIG. 4 and as shown in cross sectional view in FIG. 5. Next, wafer 24 is rinsed in deionized water for 10 minutes, dried, and inspected, as shown in steps 102 to 104. If lead-tin solder bumps have been successfully removed, the wafer is now ready for the sideways etch process.

Figure 4A:
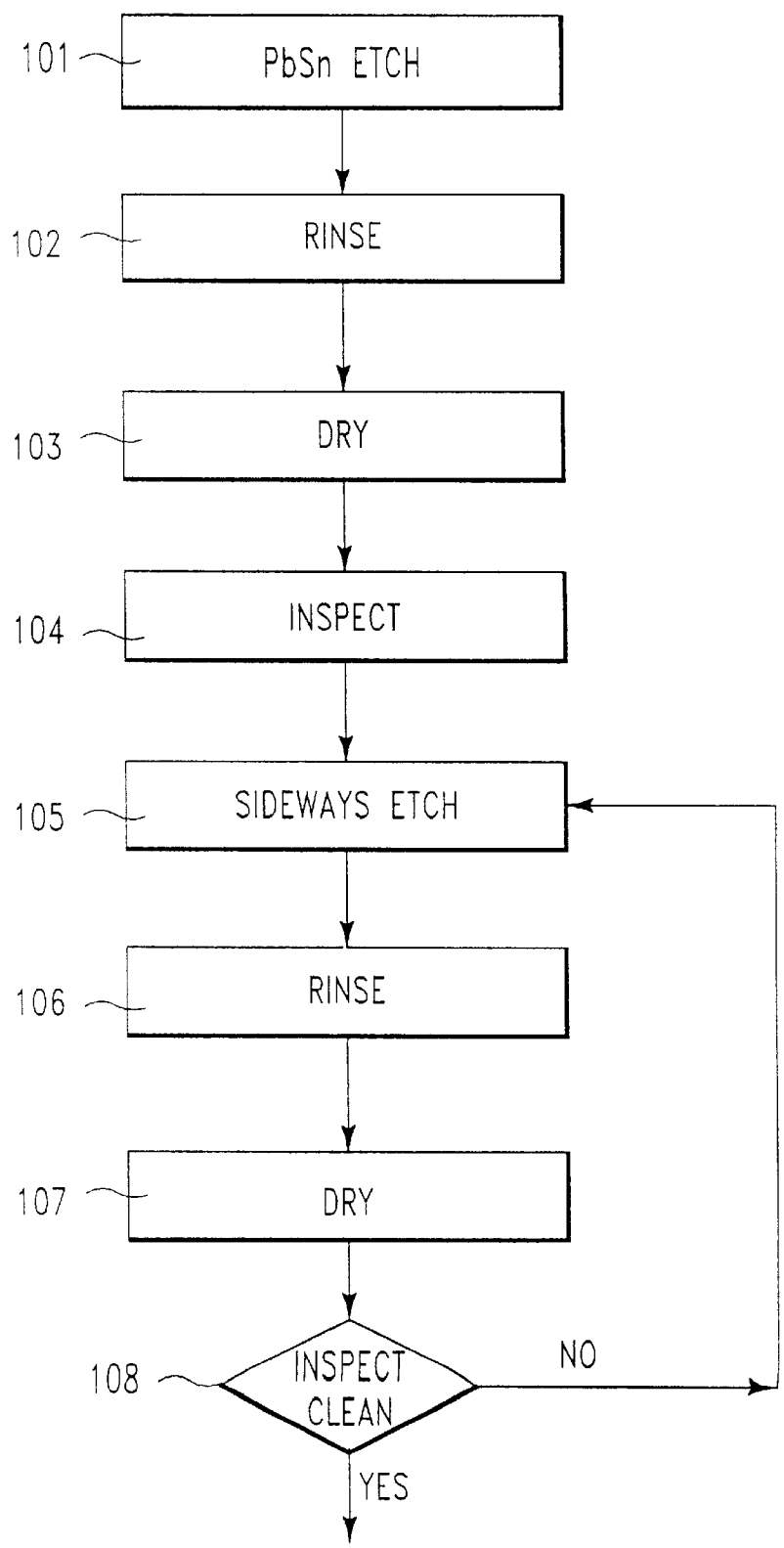
FIG. 4 is a flow chart showing the process steps to remove the solder bumps and seed layer under the solder bump without damaging permanent layers of the wafer.
Figure 4B:
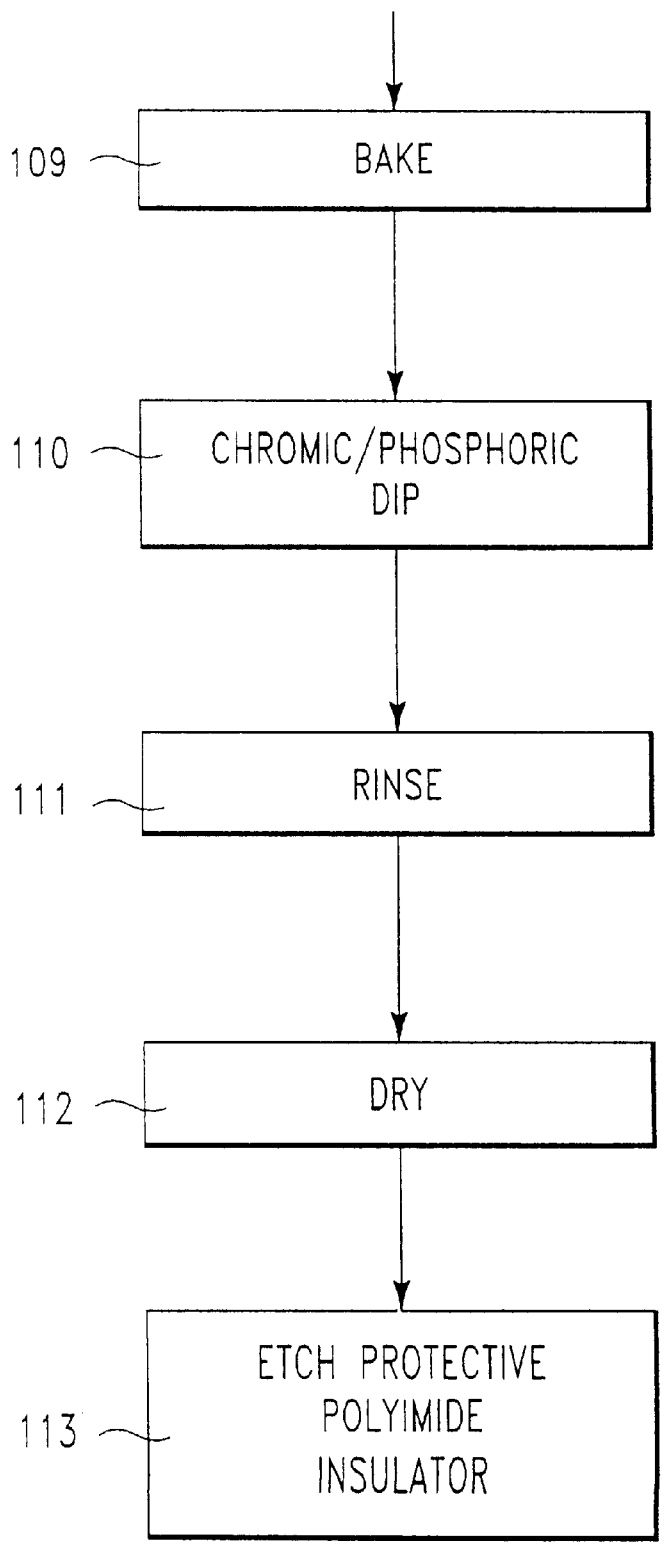
Figure 5:
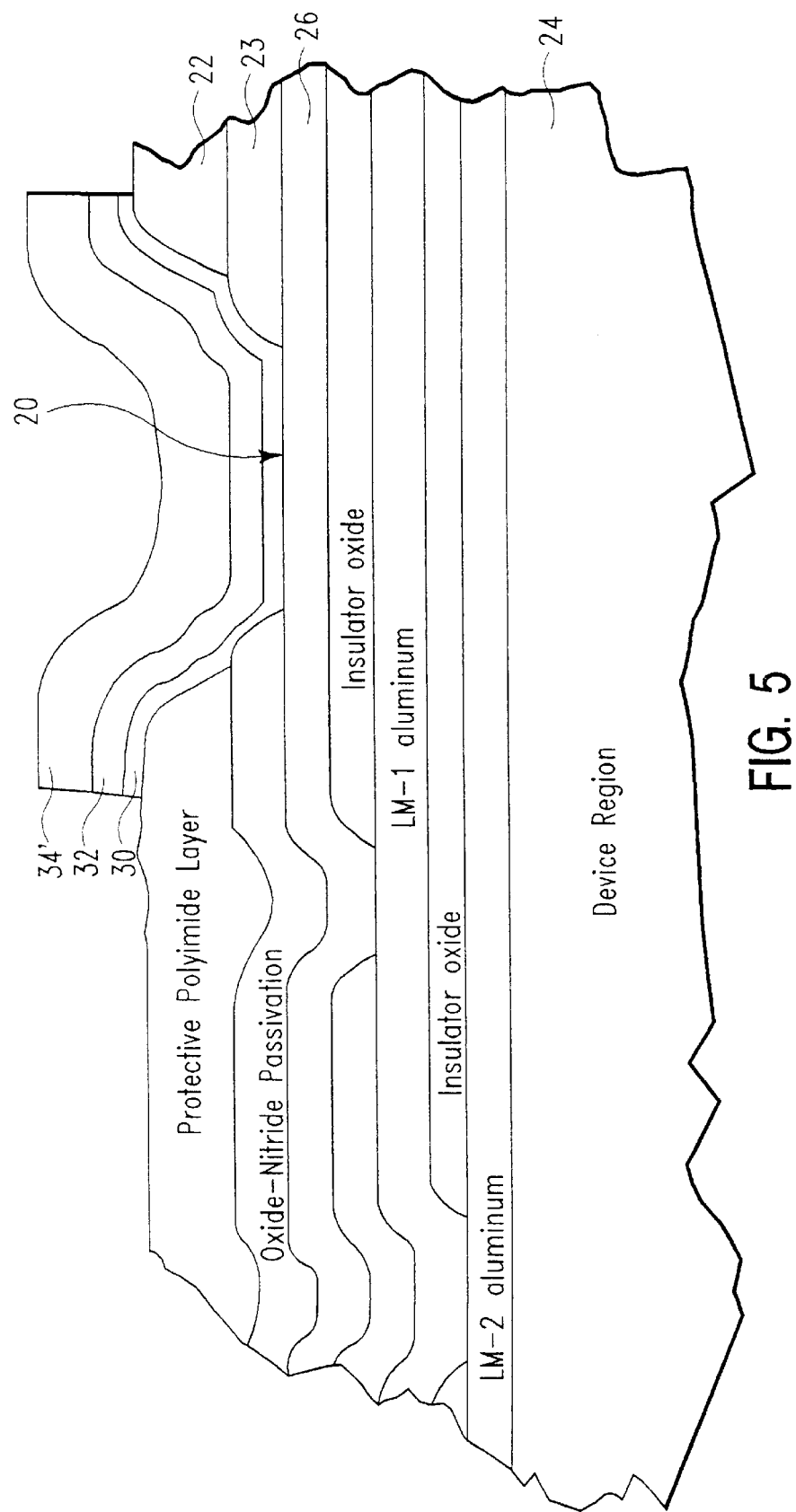
FIG. 5 is a cross sectional view showing the semiconductor wafer of FIG. 3 after removal of the solder bumps.
Figure 6:
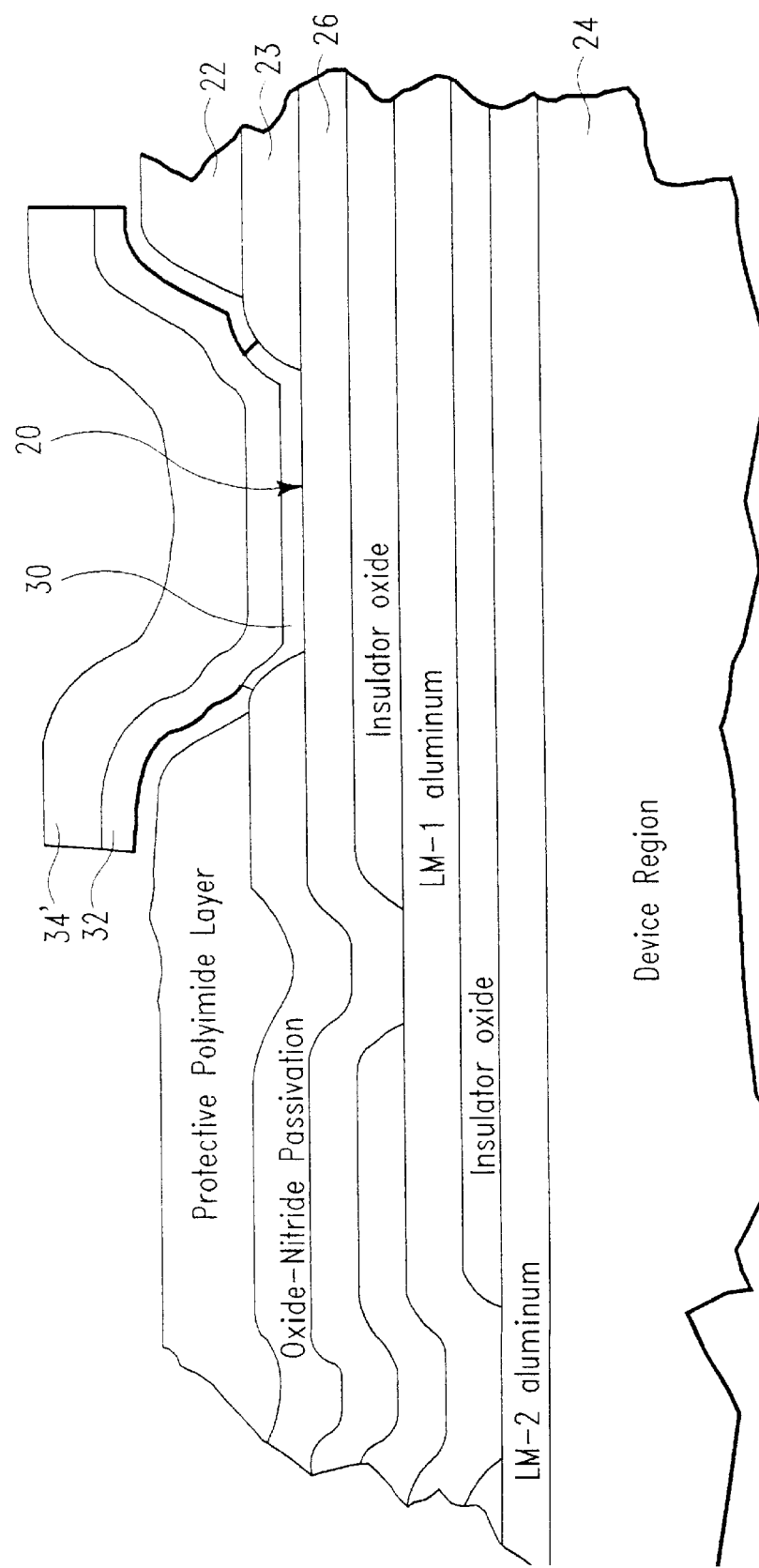
FIG. 6 is a cross sectional view showing the semiconductor wafer of FIG. 5 during the sideways etch of the TiW layer.
Figure 7:
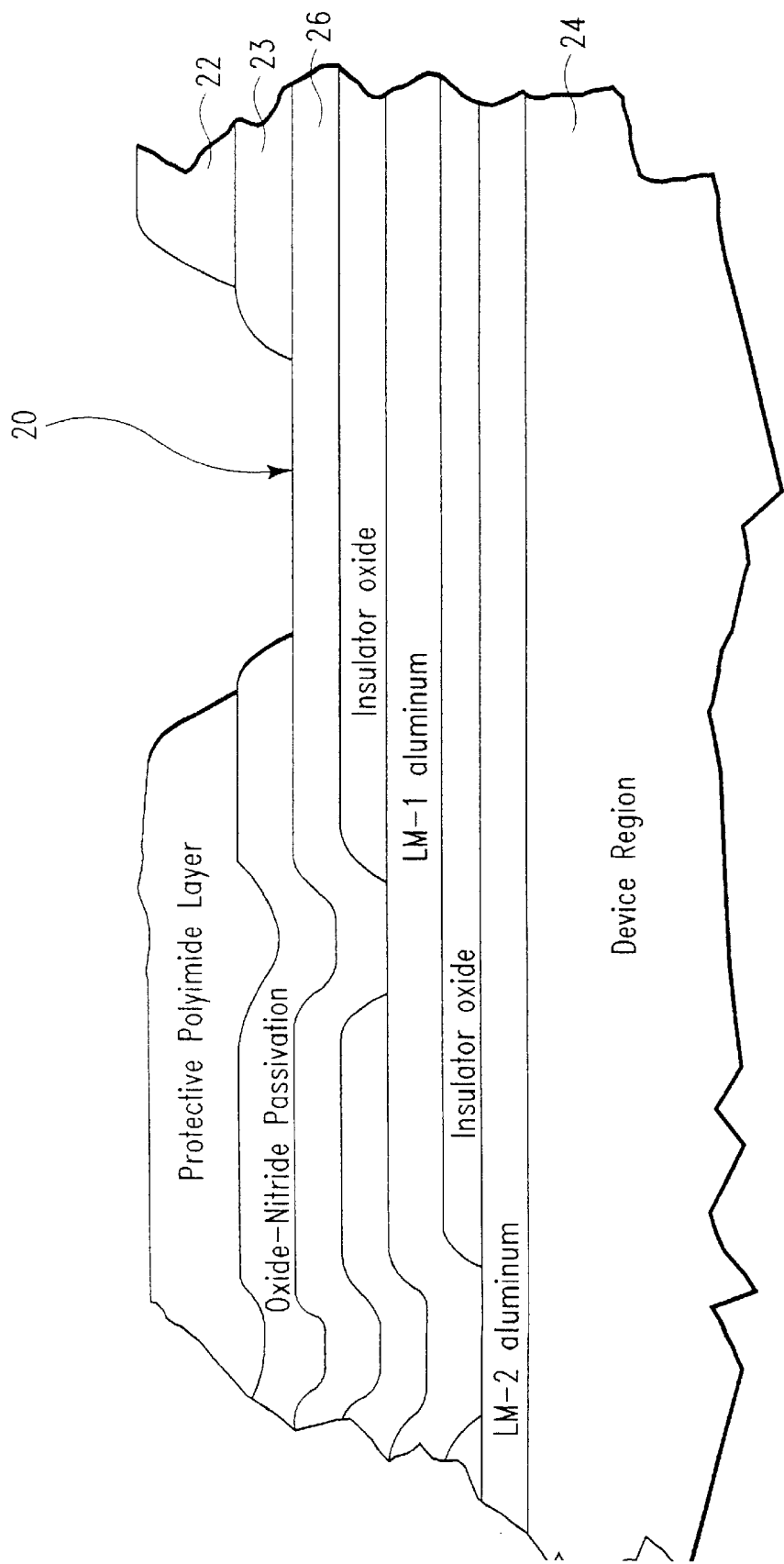
FIG. 7 is a cross sectional view showing the semiconductor wafer of FIG. 6 after the sideways etch of the TiW layer has been completed showing negligible damage to the last aluminum metal.

For the sideways etch, wafer 24 is immersed in a tank having a freshly mixed solution of five parts 30% $H_2O_2$ to one part $NH_4OH$ (by volume) for 30 minutes at room temperature while agitating or stirring to sideways etch TiW layer 30, as shown in step 105 of the flow chart in FIG. 4. The partial etch of TiW layer 30 is shown in cross sectional view in FIG. 6 and its full etch exposing bare and undamaged aluminum layer 26 is shown in FIG. 7. Next, wafer 24 is rinsed in deionized water for 10 minutes, dried, and inspected, as shown in steps 106 to 108. If all traces of terminal metals 38 have been removed, the wafer is ready for a bake step at 110° C. for 30 minutes to drive off volatile species, as shown in step 109 and then a chromic acid/phosphoric acid dip to passivate exposed aluminum surfaces, as shown in step 110. This dip is followed by deionized water rinse and dry, as shown in steps 111–112. If the inspection in step 108 shows residual traces of seed layer 28, the sideways etch of step 105 is repeated using freshly mixed chemical. Thus, solder bump 36 and seed layer 28 is removed without any chemical being applied to wafer 24 that can damage final aluminum metal 26.

Figure 8:
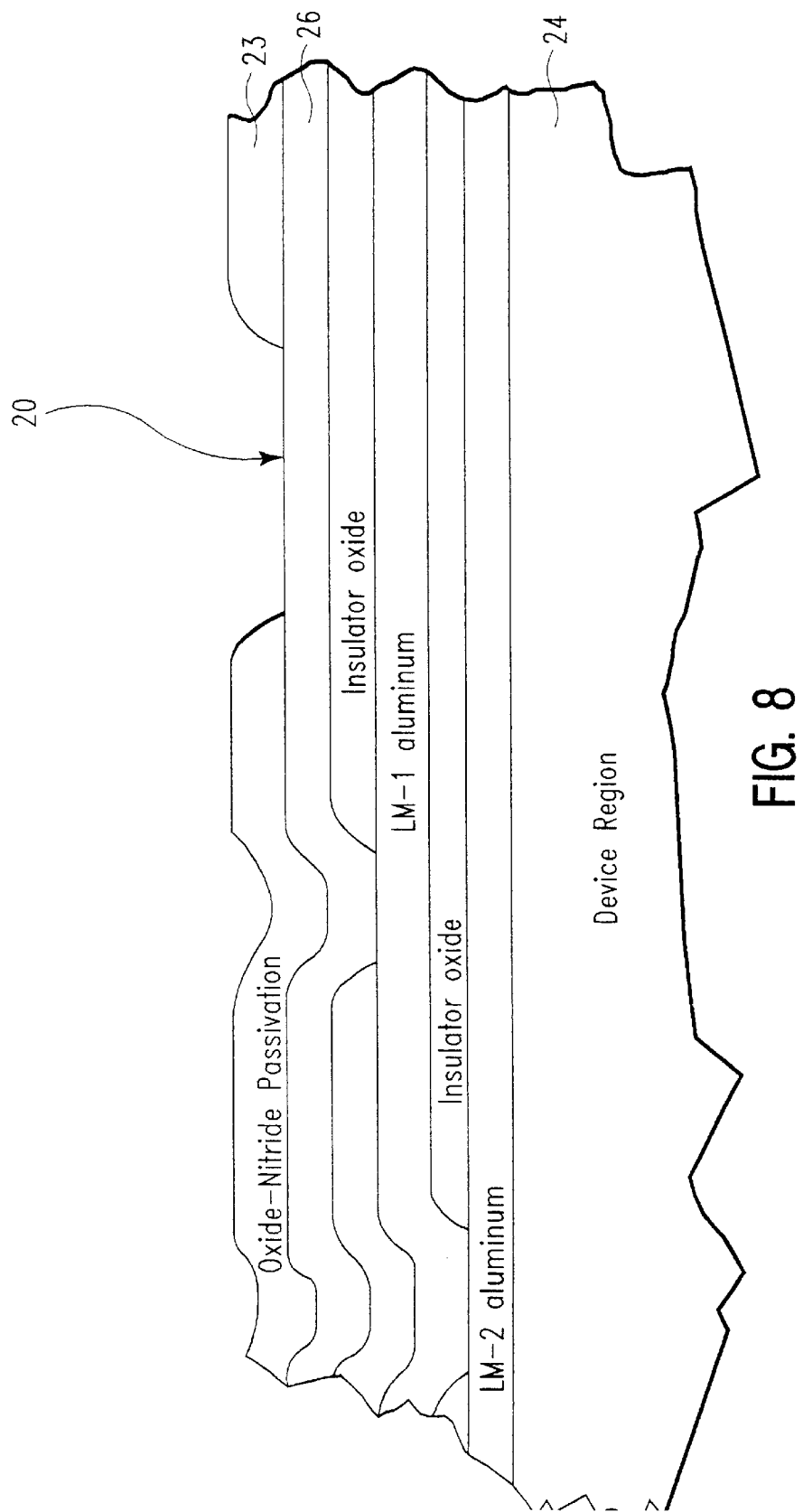
FIG. 8 is a cross sectional view showing the semiconductor wafer of FIG. 7 after the removal of the polyimide insulating layer.

In the last step, polyimide layer 22 is removed using a dry etch, as shown in step 113 of the flow chart in FIG. 4 and in cross sectional view in FIG. 8. Processes to remove polyimide are well known in the art and include an oxygen reactive ion etch. The inventors found that the extended chemical processing to sideways etch TiW layer 30 can have a negative effect on original polyimide layer 22 and they determined that removal and replacement of this layer with a freshly deposited layer of polyimide is preferred for a properly reworked wafer. Once the new layer of polyimide has been spun on and patterned to form new vias 20, new terminal metals can be redeposited.

In addition to its application for electroplated solder bumps, the present invention can be applied for rework of evaporated solder bumps. In this embodiment a TiW layer is sputtered in contact with aluminum last metal in contact vias before any other metal layer is applied. Standard chrome, copper, and gold are then sputtered and the solder bump is evaporated. In this case the tin-copper intermetallic layer formed during rework is difficult to remove without risk of damaging aluminum lines of the wafer. For rework, the process described herein above is used to first remove the solder and then the TiW is sideways etched to lift off all overlying layers, including the tin-copper intermetallic layer, without threat of damaging aluminum lines of the wafer.

While several embodiments of the invention, together with modifications thereof, have been described in detail herein and illustrated in the accompanying drawings, it will be evident that various further modifications are possible without departing from the scope of the invention. For example, any metal of a stack of metals can be removed by sideways etching a lower layer metal. Nothing in the above specification is intended to limit the invention more narrowly than the appended claims. The examples given are intended only to be illustrative rather than exclusive.

What is claimed is:

1. A terminal metal rework process, comprising the steps of:
   a) providing a semiconductor wafer having terminal metals thereon comprising a solder bump on layers of underlying metals, wherein said layers of underlying metals comprise a first metal layer on a second metal layer on said wafer, said wafer further comprising a permanent third aluminum metal layer, and wherein said second metal layer contacts said permanent third aluminum metal layer;
   b) selectively removing said solder bumps from said substrate with an acidic solder etchant; and then
   c) selectively removing said first metal layer and said second metal layer from said substrate by sideways etching said second metal layer with an etchant that does not substantially etch said first metal layer and that does not substantially damage said permanent third aluminum layer.

2. The removal process as recited in claim 1, wherein said solder bump comprises lead and tin.

3. The removal process as recited in claim 1, wherein said second metal layer comprises titanium, tungsten, or an alloy of titanium and tungsten.

4. The rework process as recited in claim 3, wherein said etchant of said selectively removing step (c) comprsises a basic solution of 30% hydrogen peroxide.

5. The removal process as recited in claim 1, wherein said first metal layer comprises chrome, copper, or tin.

6. The removal process as recited in claim 5, wherein said first metal layer comprises a chrome-copper intermetallic or a tin-copper intermetallic.

\* \* \* \* \*